United States Patent
Noguchi et al.

(10) Patent No.: US 10,334,717 B2
(45) Date of Patent: Jun. 25, 2019

(54) OPTICAL SUBASSEMBLY, OPTICAL MODULE, AND OPTICAL TRANSMISSION EQUIPMENT

(71) Applicant: Oclaro Japan, Inc., Sagamihara, Kanagawa (JP)

(72) Inventors: Daisuke Noguchi, Kanagawa (JP); Hiroshi Yamamoto, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/956,945

(22) Filed: Apr. 19, 2018

(65) Prior Publication Data

US 2018/0310397 A1 Oct. 25, 2018

(30) Foreign Application Priority Data

Apr. 24, 2017 (JP) ................. 2017-085431

(51) Int. Cl.

| H05K 1/18 | (2006.01) |
|---|---|
| H05K 1/02 | (2006.01) |
| H05K 3/10 | (2006.01) |
| H01S 5/022 | (2006.01) |
| H05K 1/14 | (2006.01) |

(52) U.S. Cl.
CPC ......... *H05K 1/025* (2013.01); *H01S 5/02276* (2013.01); *H05K 1/0274* (2013.01); *H05K 1/141* (2013.01); *H05K 1/189* (2013.01); *H05K 3/103* (2013.01); *H05K 2201/10121* (2013.01); *H05K 2203/049* (2013.01)

(58) Field of Classification Search
CPC ....... H05K 1/025; H05K 1/0274; H05K 1/189

USPC ........................................................ 362/382
See application file for complete search history.

(56) References Cited

U.S. PATENT DOCUMENTS

| 6,074,102 A | 6/2000 | Oikawa | |
|---|---|---|---|
| 7,750,764 B2 * | 7/2010 | Snodgrass | H01P 5/085 333/260 |
| 2004/0126066 A1 * | 7/2004 | Keh | G02B 6/4201 385/92 |
| 2005/0141825 A1 * | 6/2005 | Lee | H01L 31/02005 385/92 |
| 2012/0267738 A1 * | 10/2012 | Kuwahara | H01L 31/0203 257/431 |
| 2014/0217570 A1 | 8/2014 | Hettler et al. | |

(Continued)

FOREIGN PATENT DOCUMENTS

| JP | 2011-134740 A | 7/2011 |
|---|---|---|
| JP | 2017-050357 A | 3/2017 |

*Primary Examiner* — Christopher M Raabe
(74) *Attorney, Agent, or Firm* — Mattingly & Malur, PC

(57) ABSTRACT

An optical subassembly includes: a conductor plate having a pair of penetration holes, both penetrating the conductor plate from an outer surface to an inner surface; a pair of lead terminals fixed in the two respective penetration holes and passing through the pair of penetration holes; a wiring board with a pair of wiring patterns arranged on a surface; and a plurality of bonding wires electrically connecting the pair of lead terminals and the pair of wiring patterns. A cross section of the pair of lead terminals on the inner surface side is larger than a cross section on the outer surface side. End faces on the inner surface side are situated within a range from +180 μm to −100 μm to the inner side from the inner surface of the conductor plate in a direction perpendicular to the inner surface.

9 Claims, 8 Drawing Sheets

(56) References Cited

U.S. PATENT DOCUMENTS

2015/0116809 A1* 4/2015 Uto .................... H01S 5/02208
359/245
2017/0064831 A1 3/2017 Noguchi et al.

* cited by examiner

OPTICAL SUBASSEMBLY, OPTICAL MODULE, AND OPTICAL TRANSMISSION EQUIPMENT

CROSS-REFERENCE TO RELATED APPLICATION

The present application claims priority from Japanese application JP2017-085431, filed on Apr. 24, 2017, the content of which is hereby incorporated by reference into this application.

BACKGROUND OF THE INVENTION

1. Field of the Invention

The present invention relates to an optical subassembly, an optical module, and an optical transmission equipment, and particularly to a technique for restraining impedance mismatch.

2. Description of the Related Art

An optical subassembly (OSA) having an optical semiconductor device has been used. Recently, not only higher speeds but also lower costs have been increasingly demanded of an optical module having one or a plurality of optical subassemblies.

The optical subassembly disclosed in US 2014/0217570 A1 has the stem. The stem has the pair of differential signal terminals, and the metal disk on which the pair of differential signal terminals are installed. The pair of differential signal terminals are fixed in the single hole penetrating the metal disk, in the state of being electrically cut off from the metal disk by the dielectric for hermetic enclosure (hereinafter this structure is referred to as a dual-pin structure). Also, each of end parts on the inner side of the pair of differential signal terminals for transmitting high-frequency signals is formed with a large diameter (hereinafter this end part is referred to as a nail head). As shown in FIG. 2 of US 2014/0217570 A1, the device 5 is arranged parallel to the top surface of the base 2 (metal disk), and the electrodes of the device 5 and (the nail heads of) connection lead wires 3 are connected together via a wire. This reduces the length of the wires and restrains the increase in characteristic impedance at the connection sites of the connection lead wires 3 (a pair of differential signal terminals).

The optical subassemblies disclosed in JP 2017-050357 A and JP 2011-134740 A each has the stem including the dielectric board. Here, the dielectric board is the first relay board 300 and the second relay board 400 shown in FIG. 1 of JP 2017-050357 A and the wiring board 4 shown in FIG. 1 of JP 2011-134740 A. The dielectric board is arranged near the lead terminals in order to restrain the increase in inductance at the lead terminal parts. The high dielectric constant of the dielectric board increases the parasitic capacitance between the dielectric board and the metal disk serving as a grounding conductor. The capacitance relaxes the increase in inductance. This restrains the increase in characteristic impedance.

The optical device described in U.S. Pat. No. 6,074,102 discloses the structure of the base member 30 (metal disk). As shown in FIG. 9 of U.S. Pat. No. 6,074,102, the inner opening of the hole 30C (penetration hole) penetrating the base member 30 is formed with a small diameter. Also, the dielectric covers the space between a signal terminal 28 having the nail head and the base member 30 serving as the ground conductor. This increases the parasitic capacitance between the base member 30 and the nail head of the signal terminal 28, thus restraining the increase in characteristic impedance.

SUMMARY OF THE INVENTION

However, the case where differential transmission lines based on the dual-pin structure disclosed in US 2014/0217570 A1 are provided inside the metal disk is not desirable because the characteristic impedance varies significantly due to the position where the differential signal terminals (lead terminals) are fixed, compared with simple coaxial lines. For example, if the distance between the pair of lead terminals is short, the electrical coupling between normal phase and reversed phase is firmer, resulting in a sudden drop in characteristic impedance.

The lead through 8 (penetration hole) shown in FIG. 1 of US No. 2014/0217570 A1 serves as a ground conductor surface of the differential transmission line and also has an elliptical shape. In order to restrain the drop in characteristic impedance of the differential transmission lines, a greater area is required than when preparing a pair of penetration holes, each forming a single line. Therefore, in the structure disclosed in US No. 2014/0217570 A1, a sufficient area for installing components cannot be secured on the base 2. The structure disclosed in US 2014/0217570 A1 is not suitable as the structure of a package for an end-face emission laser diode (optical device 200) as described in JP 2017-050357 A and JP 2011-134740 A. According to a study conducted by the inventors, it is expected that the application of the structure disclosed in US No. 2014/0217570 A1 cannot secure good waveform quality in an optical transmitter which requires a band equal to or higher than the drive frequency.

Moreover, considering the work of soldering flexible printed circuits (FPC) mounted as an interface for electrical connection to a printed circuit board (PCB) from an optical subassembly, to a pair of differential signal terminals on the outer end faces, there is a possibility that an electrical short circuit may occur and thus cause a drop in yield, due to the very narrow space between the pair of differential signal terminals. To realize stable manufacture, a package using simple coaxial lines instead of a dual-pin structure, thus enabling relaxation of impedance mismatch, is desirable.

The hole 30C (penetration hole) penetrating the base member 30 (metal disk) disclosed in U.S. Pat. No. 6,074,102 needs stamping at least twice in order to form parts with different diameters. This increases component costs, compared with when a penetration hole with a single diameter is provided. Therefore, using the related-art techniques, it is difficult to meet the market demand for lower costs that is expected from now on.

In view of the foregoing problems, an object of the invention is to provide an optical subassembly, an optical module, and an optical transmission equipment that can restrain impedance mismatch by a simple process.

(1) In order to solve the foregoing problems, according to an aspect of the invention, an optical subassembly includes: a conductor plate having a pair of penetration holes, both penetrating the conductor plate from an outer surface to an inner surface; a pair of lead terminals fixed in the two respective penetration holes by a dielectric and passing through the pair of penetration holes from the outer surface to the inner surface; a wiring board with a pair of wiring patterns arranged on a surface; and a plurality of bonding wires electrically connecting the pair of lead terminals and the pair of wiring patterns. Across section of the pair of lead terminals at an end part on the inner surface side is larger than a cross section at an end part on the outer surface side. End faces on the inner surface side of the pair of lead terminals are situated within a range from +180 µm to −100 µm to the inner side from the inner surface of the conductor plate in a direction perpendicular to the inner surface.

(2) The optical subassembly described in the above (1) may further include a pedestal section arranged protruding further to the inner side from the inner surface of the conductor plate. The wiring board may be arranged on a top surface of the pedestal section.

(3) In the optical subassembly described in the above (1) or (2), the plurality of bonding wires may connect the end faces of the inner surface side of the pair of lead terminals and the pair of wiring patterns. Flat surfaces of the pair of wiring patterns on the wiring board may intersect the end faces on the inner surface side of the pair of lead terminals.

(4) In the optical subassembly described in one of the above (1) to (3), the bonding wires connecting one of the pair of lead terminals and one of the pair of wiring patterns may come in three or more.

(5) In the optical subassembly described in the above (4), the three or more bonding wires may spread further from a site connected to the end face on the inner surface side of the one of the pair of lead terminals and may be connected to the one of the pair of wiring patterns.

(6) In the optical subassembly described in one of the above (1) to (5), the plurality of bonding wires connecting one of the pair of lead terminals and one of the pair of wiring patterns may be ribbon wires.

(7) The optical subassembly described in one of the above (1) to (6) may further include an optical semiconductor device arranged on the wiring board. The pair of wiring patterns may connect to each of a pair of electrodes of the optical semiconductor device and may each spread and extend from a connection site with the optical semiconductor device to a connection site with the plurality of bonding wires, as viewed in a plan view.

(8) In the optical subassembly described in one of the above (1) to (6), the wiring board may be configured of a relay board to which the plurality of bonding wires is connected and a second wiring board electrically connected to the relay board.

(9) The optical subassembly described in the above (8) may further include an optical semiconductor device arranged on the second wiring board.

(10) According to another aspect of the invention, an optical module may include the optical subassembly described in one of the above (1) to (9).

(11) According to another aspect of the invention, an optical transmission equipment may be equipped with the optical module described in the above (10).

The invention provides an optical subassembly, an optical module, and an optical transmission equipment that can restrain impedance mismatch by a simple process.

DETAILED DESCRIPTION OF THE INVENTION

Hereinafter, an embodiment of the invention will be described specifically and in detail, based on the drawings. In all of the drawings to explain the embodiment, members having the same functions are denoted by the same reference signs and not described repeatedly. The illustrations given below simply explain an example of embodiment. The sizes in the illustration do not necessarily coincide with the scales described in the example of embodiment.

Figure 1:
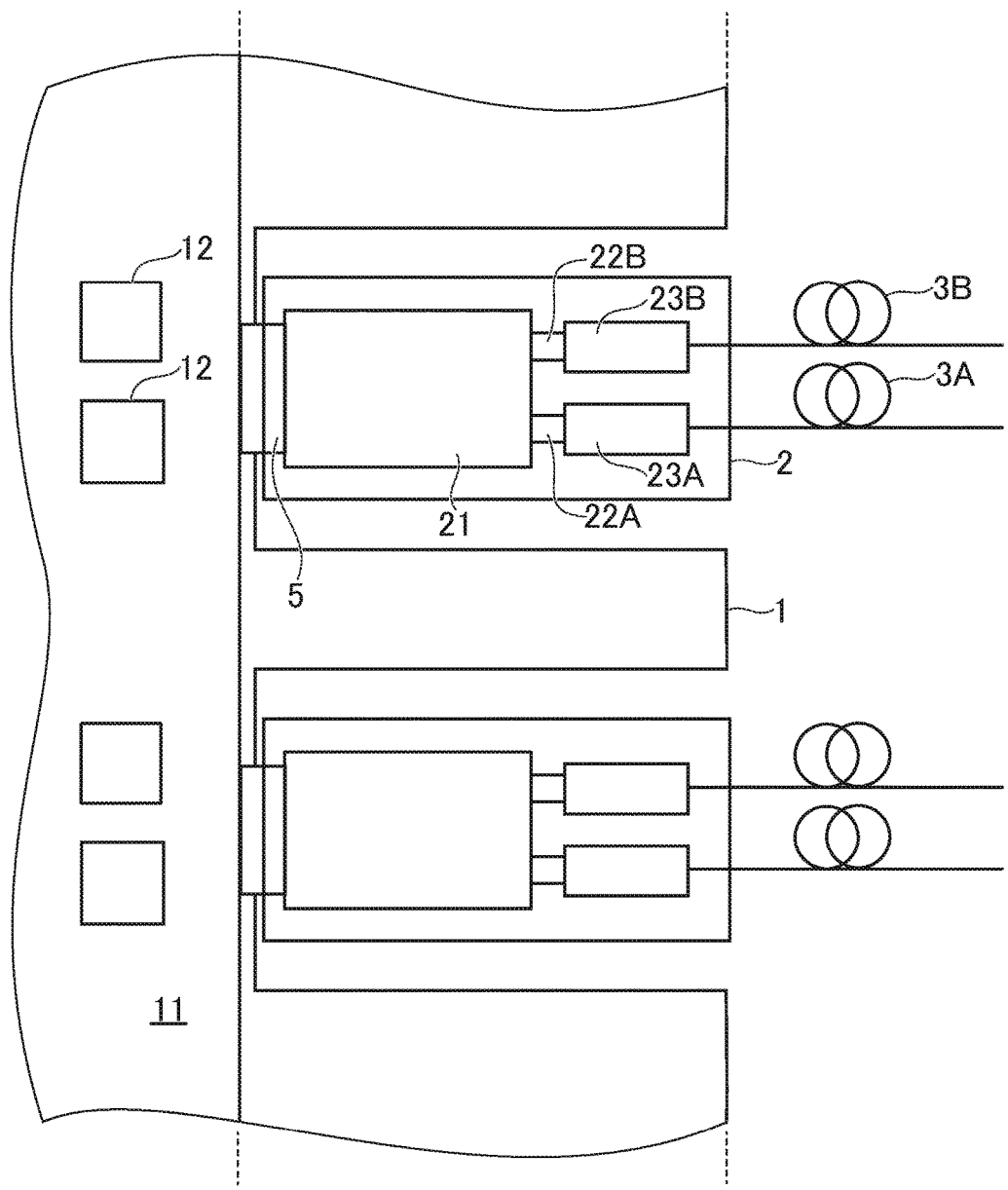
FIG. 1 is a schematic view showing the configuration of an optical transmission equipment and an optical module according to an embodiment of the invention.

FIG. 1 is a schematic view showing the configuration of an optical transmission equipment 1 and an optical module 2 according to an embodiment of the invention. The optical transmission equipment 1 has a printed circuit board 11 (PCB) and an IC 12. The optical transmission equipment 1 is, for example, a large-capacity router or switch. The optical transmission equipment 1 has, for example, the function of a switchboard and is arranged at a base station or the like. The optical transmission equipment 1 is equipped with a plurality of optical modules 2, acquires data for reception (electrical receiving signals) via the optical modules 2, determines where and what data to be transmitted, using the IC 12 or the like, generates data for transmission (electrical transmission signals), and communicates the data to the corresponding optical module 2 via the printed circuit board 11.

The optical module 2 is a transceiver having a transmitter function and a receiver function. The optical module 2 includes a printed circuit board 21, an optical receiver module 23A which converts an optical signal received via an optical fiber 3A into an electrical signal, and an optical transmitter module 23B which converts an electrical signal into an optical signal and transmits the optical signal to an optical fiber 3B. The printed circuit board 21, and the optical receiver module 23A and the optical transmitter module 23B are connected via flexible printed circuits 22A, 22B (FPC), respectively. An electrical signal is transmitted from the optical receiver module 23A to the printed circuit board 21 via the flexible printed circuits 22A. An electrical signal is transmitted from the printed circuit board 21 to the optical transmitter module 23B via the flexible printed circuits 22B. The optical module 2 and the optical transmission equipment 1 are connected via an electrical connector 5. The optical receiver module 23A and the optical transmitter module 23B are electrically connected to the printed circuit board 21 and convert an optical signal/electrical signal into an electrical signal/optical signal.

A transmission system according to the embodiment includes two or more optical transmission equipments 1, two or more optical modules 2, and one or more optical fibers 3. One or more optical modules 2 are connected to each optical transmission equipment 1. The optical fiber 3 connects the optical modules 2 connected to each of two optical transmission equipments 1. Data for transmission generated by one optical transmission equipment 1 is converted into an optical signal by the optical module 2 connected thereto. This optical signal is transmitted to the optical fiber 3. An optical signal transmitted through the optical fiber 3 is received by the optical module 2 connected to the other optical transmission equipment 1. The optical signal is converted into an electrical signal by the optical module 2 and transmitted as data for reception to this other optical transmission equipment 1.

Figure 2:
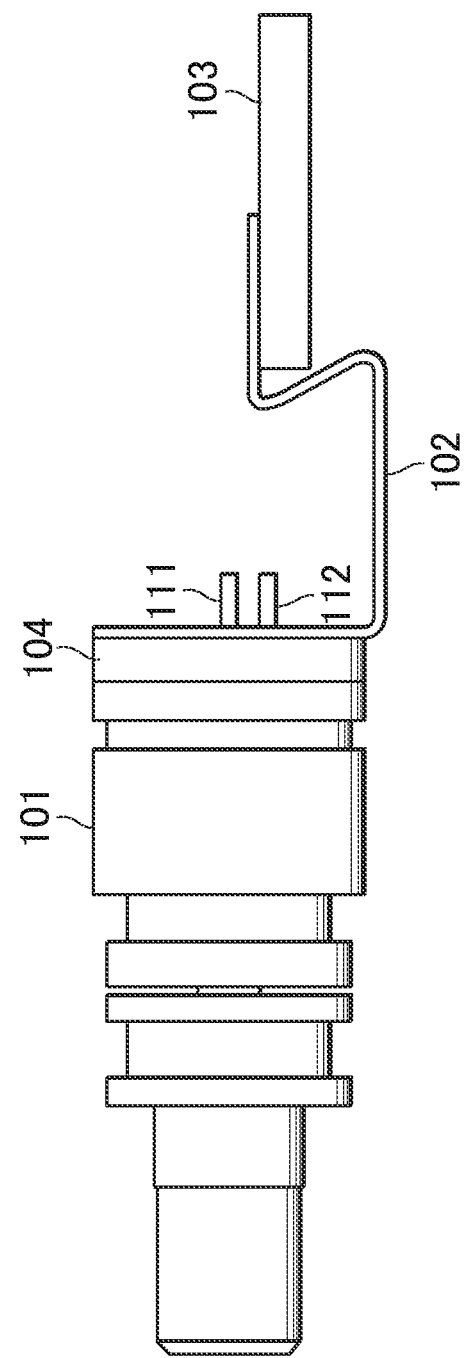
FIG. 2 is a side view of an optical subassembly according to the embodiment of the invention.

FIG. 2 is a side view of an optical subassembly 101 according to the embodiment. The optical transmitter module 23B provided in the optical module 2 has one or a plurality of optical subassemblies 101. The optical transmitter module 23B according to the embodiment has one optical subassembly which carries out optical signal transmission of 25 Gbits/s grade. The optical subassembly 101 according to the embodiment is a TO-CAN package-type TOSA (transmitter optical subassembly). Flexible printed circuits 102 are connected to the optical subassembly 101. The flexible printed circuits 102 are also connected to a printed circuit board 103. Here, the flexible printed circuits 102 are a part or the entirety of the flexible printed circuits 22B. The printed circuit board 103 is the printed circuit board 21. A modulated electrical signal is transmitted from a drive IC (not illustrated) installed on the printed circuit board 103 to the optical transmission equipment 1 via the flexible printed circuits 102 connected to the printed circuit board 103 by a solder or the like. The optical subassembly 101 according to the embodiment has a stem 104 on the side connected to the flexible printed circuits 102. The stem 104 has a lead terminal pair 111 and a ground terminal 112.

Figure 3:
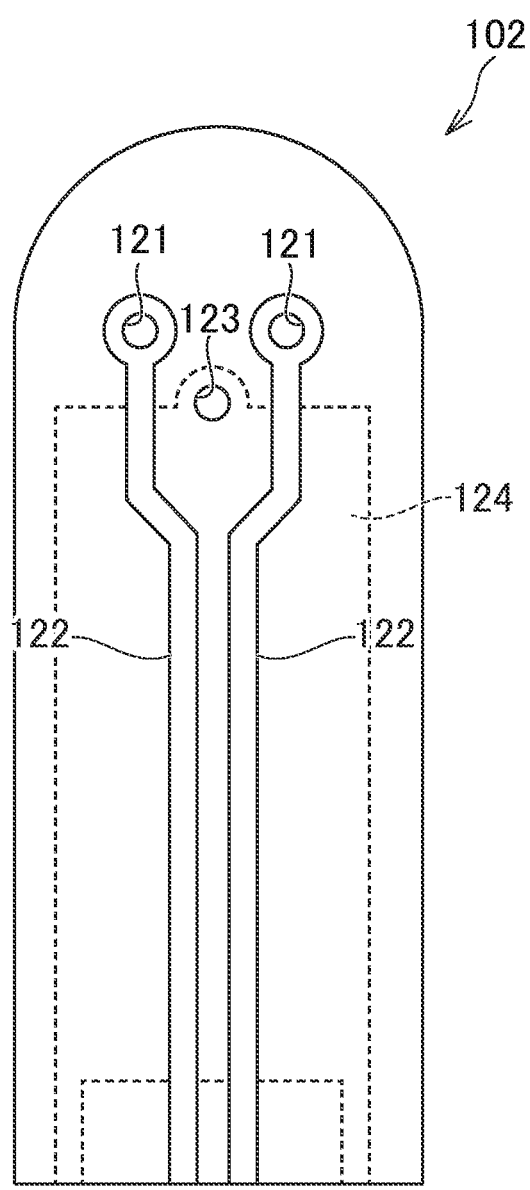
FIG. 3 is a plan view of flexible printed circuits according the embodiment of the invention.

FIG. 3 is a plan view of the flexible printed circuits 102 according to the embodiment. On the face side of a main body of the flexible printed circuits 102 made up of a dielectric, a pair of strip conductors 122, each having a through-hole 121 at one end, are arranged (a metalized pattern is formed). On the back side of the flexible printed circuits 102, a ground conductor layer 124 (solid pattern) having a through-hole 123 at one end is arranged (a metalized pattern is formed). The pair of strip conductors 122 and the ground conductor layer 124 form microstrip lines for transmitting a modulated electrical signal. The pair of microstrip lines have stable impedance characteristics up to a high frequency domain. The flexible printed circuits 102 and the optical subassembly 101 are arranged in such a way that the back side of the flexible printed circuits 102 come in contact with the outer surface of the stem 104 of the optical subassembly 101 and that the lead terminal pair 111 and the ground terminal 112 provided in the stem 104 pass through the through-holes 121, 123, respectively. The lead terminal pair 111 and the pair of strip conductors 122 are connected by a solder or the like. Similarly, the ground terminal 112 is connected to the ground conductor layer 124.

Figure 4:
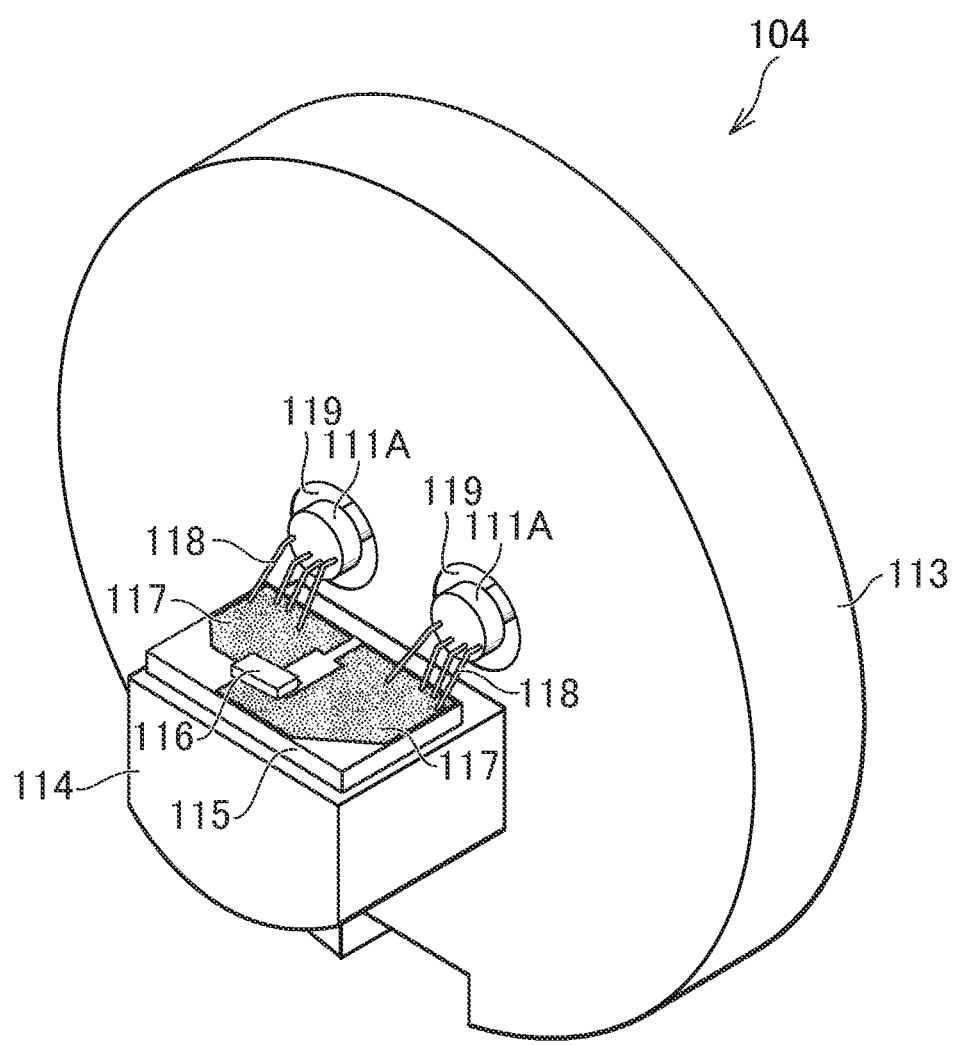
FIG. 4 is a perspective view showing the structure of a stem according to the embodiment of the invention.

FIG. 4 is a perspective view showing the structure of the stem 104 according to the embodiment. FIG. 4 schematically shows the structure inside the optical subassembly 101 of the stem 104. The stem 104 has a pair of differential signal terminals 111, a (single) ground terminal 112 (not illustrated), a metal disk 113 (conductor plate) serving as a main body, a pedestal section 114, a ceramic substrate 115 arranged on the top surface of the pedestal section 114, an optical semiconductor device 116 installed on the ceramic substrate 115, and a plurality of bonding wires 118.

The metal disk 113 has an inner surface, an outer surface, and a lateral surface. In FIG. 4, the inner surface facing the inside of the optical subassembly 101 is shown. The outer surface (not illustrated) is the surface opposite to the inner surface. The outer surface of the metal disk 113 comes in contact with and is connected to the back side of the flexible printed circuits 102. The metal disk 113 has a pair of penetration holes, both penetrating the metal disk 113 from the outer surface to the inner surface. The pedestal section 114 is arranged protruding further to the inner side from the inner surface of the metal disk 113. Here, the pedestal section 114 is fixed in contact with the inner surface of the metal disk 113 and protrudes in a direction perpendicular to the inner surface. The pedestal section 114 function as a heat radiator (heat radiation stage) having high thermal conductivity. The top surface of the pedestal section 114 is a flat surface spreading perpendicularly to the inner surface. Ideally, the top surface of the pedestal section 114 is parallel to the direction of extension of each of the pair of differential signal terminals 111.

The pair of differential signal terminals 111 are a pair of lead terminals arranged in such a way as to pass respectively through the pair of penetration holes from the outer surface to the inner surface. A dielectric 119 fills each space between the pair of penetration holes and the pair of differential signal terminals 111. The dielectric 119 fixes the pair of differential signal terminals 111 to the metal disk 113 and electrically cuts off the pair of differential signal terminals 111 from the metal disk 113. The ground terminal 112 is a ground lead terminal (case pin) brazed on the outer surface of the metal disk 113. The pair of differential signal terminals 111 and the pair of penetration holes in the metal disk 113 form a pair of coaxial transmission lines (differential transmission lines).

The ceramic substrate 115 is a wiring board (thin film board) having a pair of wiring patterns 117 arranged on its top surface. The optical semiconductor device 116 in this example is a semiconductor laser device (laser diode) but is not limited to this. As the material of the wiring board, a material having a value close to the coefficient of thermal expansion of the optical semiconductor device 116 is desirable. For example, a ceramic material such as aluminum nitride is desirable. The ceramic substrate 115 is die-bonded to the top surface of the pedestal section 114.

The plurality of bonding wires 118 electrically connect the pair of differential signal terminals 111 and the pair of wiring patterns 117. Here, the number of the bonding wires 118 connecting one (or the other) of the pair of differential signal terminals 111 and one (or the other) of the pair of wiring patterns 117 is four. That is, eight bonding wires 118 in total are arranged. The plurality of (in this example, four) bonding wires 118 connect the end face on the inner surface side (of the metal disk 113) of one (or the other) of the pair of differential signal terminals 111 and one (or the other) of the pair of wiring patterns 117. Also, the flat surfaces of the pair of wiring patterns 117 intersect the end faces on the inner surface side of the pair of differential signal terminals 111 (end faces of nail head sections 111A). It is more desirable that the flat surfaces of the pair of wiring patterns 117 are substantially orthogonal to the end faces.

The optical subassembly 101 according to the embodiment has the following two main features. The first feature is that the cross section of the pair of differential signal terminals 111 at the end part on the inner surface side is larger than the cross section at the end part on the outer surface side. Here, each of the pair of differential signal terminals 111 has a main section and a nail head section 111A. The main section is in the shape of a lead wire (elongate cylindrical shape). Ideally, the nail head section 111A is disk-shaped (cylindrical shape with a spreading bottom surface). Therefore, each of the pair of differential signal terminals 111 is in the shape of a nail (spike). The lead diameter of the nail head section 111A is greater than the lead diameter of the end part on the outer surface side (main section).

The second feature is that the end faces on the inner surface side of the pair of differential signal terminals 111 (end faces of the nail head sections 111A) are situated within a range from +180 μm to −100 μm to the inner side from the inner surface of the metal disk 113 in a direction perpendicular to the inner surface. The second feature will be described in detail below.

Figure 5:
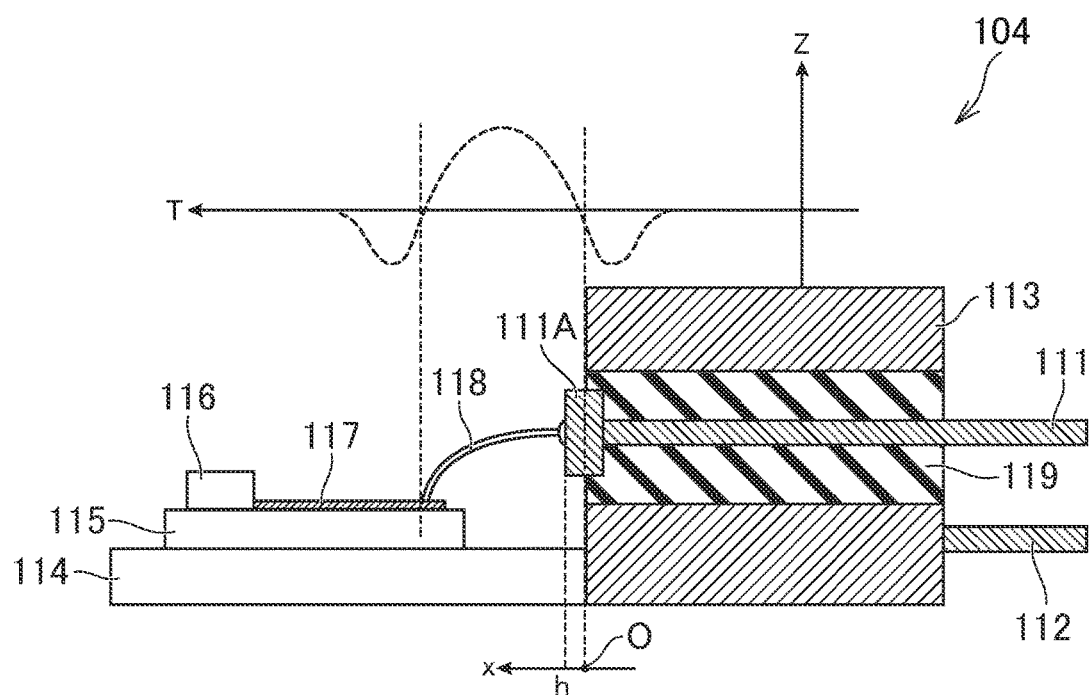
FIG. 5 is a schematic view showing a cross section of a stem 104 according to the embodiment of the invention, and change in characteristic impedance with time.

FIG. 5 is a schematic view showing a cross section of the stem 104 according to the embodiment and change in characteristic impedance with time. FIG. 5 schematically showing a cross section which is parallel to the sheet surface of FIG. 2 and which penetrates the center of one of the pair of differential signal terminals 111. This cross section is different from the actual cross-sectional view. As illustrated in FIG. 5, an x-axis is defined, with the inner surface of the metal disk 113 set as the origin O, and an inward direction perpendicular to the inner surface (leftward direction in FIG. 5) as positive. In the graph showing change in characteristic impedance with time, the vertical axis represents characteristic impedance Z and the horizontal axis represents time T. The position of the end faces on the inner surface side of the pair of differential signal terminals 111 (end faces of the nail head sections 111A) is defined by a height h along the x-axis. Here, the outer diameter of the metal disk 113 is 5.6 mm and the inner diameter of each penetration hole is 700 μm. The lead diameter of the main section (part other than the nail head section 111A) of each of the pair of differential signal terminals 111 is 250 μm. The lead diameter of each nail head section 111A is 450 μm. The thickness (along the x-axis direction) of each nail head section 111A is 150 μm. The length along the x-axis of the pedestal section 114 is 1.4 mm. The position (height h) of the edge on the inner surface side of the ceramic substrate 115 from the inner surface is 150 μm to 200 μm. The dielectric 119 is a glass with a dielectric constant of 6.7.

Generally, when electrically connecting a lead terminal and a wiring pattern via a bonding wire, the lead terminal needs to protrude to a sufficient length from the inner surface of the metal disk so as to secure a space for wire bonding. That is, in the case of FIG. 5, a large height h needs to be secured. This is particularly true if the number of bonding wires is increased. According to the related art, the lateral side of the part protruding from the inner surface, of the lead terminal, and the wiring pattern on the wiring board are connected via a plurality of bonding wires. However, the inventors have found the following as a result of an extensive study. That is, the part protruding from the inner surface (part of x=0 to h), of the lead terminal, shows inductiveness, thus increasing inductance. Consequently, characteristic impedance suddenly increases, causing a large impedance mismatch. Thus, a transmission property that is necessary for high-speed signal transmission, for example, at 25 Gbits/s, cannot be achieved.

In contrast, in the stem 104 according to the embodiment, the end face (height h) of each of the pair of differential signal terminals 111 is situated within a range of +180 μm to −100 μm from the inner surface of the metal disk 113. This can reduce the inductance due to the end parts of the pair of differential signal terminals 111 and can also add the capacitance generated between the end parts (nail head sections 111A) of the differential signal terminals 111 and the metal disk 113. That is, the capacitance generated between the end parts of the pair of differential signal terminals 111 and the metal disk 113 compensates for the inductance due to the end parts of the pair of differential signal terminals 111. This can restrain the increase in characteristic impedance. As illustrated by the change in characteristic impedance with time shown in FIG. 5, the capacitance in the characteristic impedance increases, corresponding to the time when a pulse reaches the inner surface of the metal disk 113. Thus, in a desired frequency domain, a characteristic impedance mismatch is averaged and a sufficient transmission property is achieved, as illustrated by the characteristic impedance shown in FIG. 5. To secure the capacitance generated between the nail head sections 111A of the pair of differential signal terminals 111 and the metal disk 113, it is desirable that at least a part of the nail head sections 111A is arranged inside the penetration holes in the metal disk 113. That is, it is desirable that the height h of the end faces on the main section side of the nail head sections 111A is a negative value.

The bonding wires 118 connect the end faces of the differential signal terminals 111 and the wiring patterns 117. Since the end faces of the differential signal terminals 111 and the wiring patterns 117 intersect each other (ideally, orthogonal to each other), the length of the bonding wires 118 can be made short and the increase in inductance can be restrained. Also, since the end faces of the differential signal terminals 111 are greater than the cross section of the main sections because of the nail head sections 111A, a plurality of bonding wires 118 can be connected to the end faces of the differential signal terminals 111.

Figure 6:
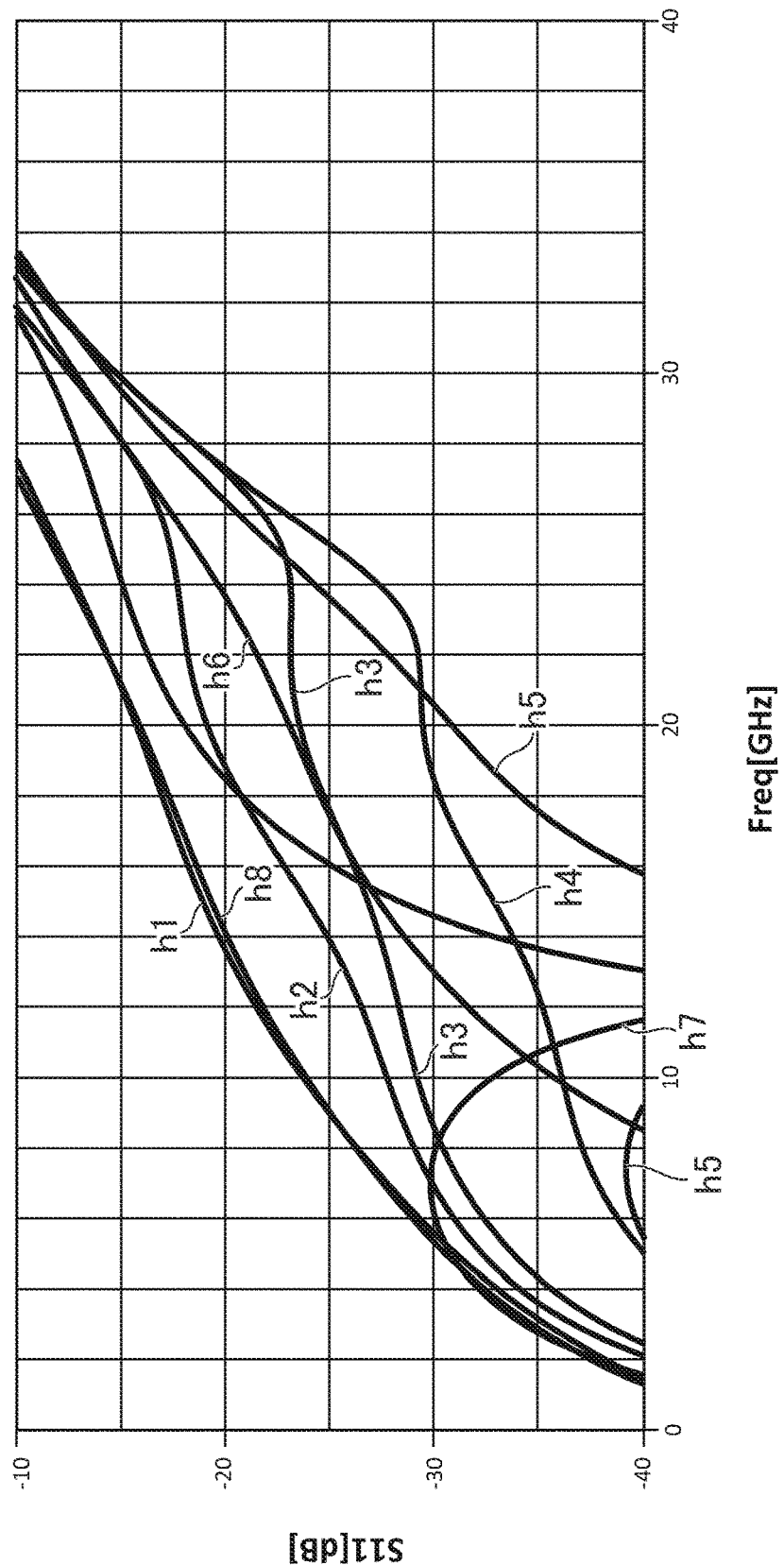
FIG. 6 shows reflection characteristics of the optical subassembly according to the embodiment of the invention.

FIG. 6 shows reflection characteristics of the optical subassembly 101 according to the embodiment. FIG. 6 shows the result of calculating reflection characteristics S11 (dB) to a frequency by a high-frequency three-dimensional electromagnetic field simulator HFSS (high frequency structure simulator). A plurality of curves in FIG. 6 shows reflection characteristics with a plurality of heights h of the end faces of the differential signal terminals 111. Specifically, h1 shows the result with a height of −100 μm, h2 shows the result with a height of −50 μm, h3 shows the result with a height of 0 μm, h4 shows the result with a height of +50 μm, h5 shows the result with a height of +100 μm, h6 shows the result with a height of +150 μm, h7 shows the result with a height of +200 μm, and h8 shows the result with a height of +250 μm.

Figure 7:
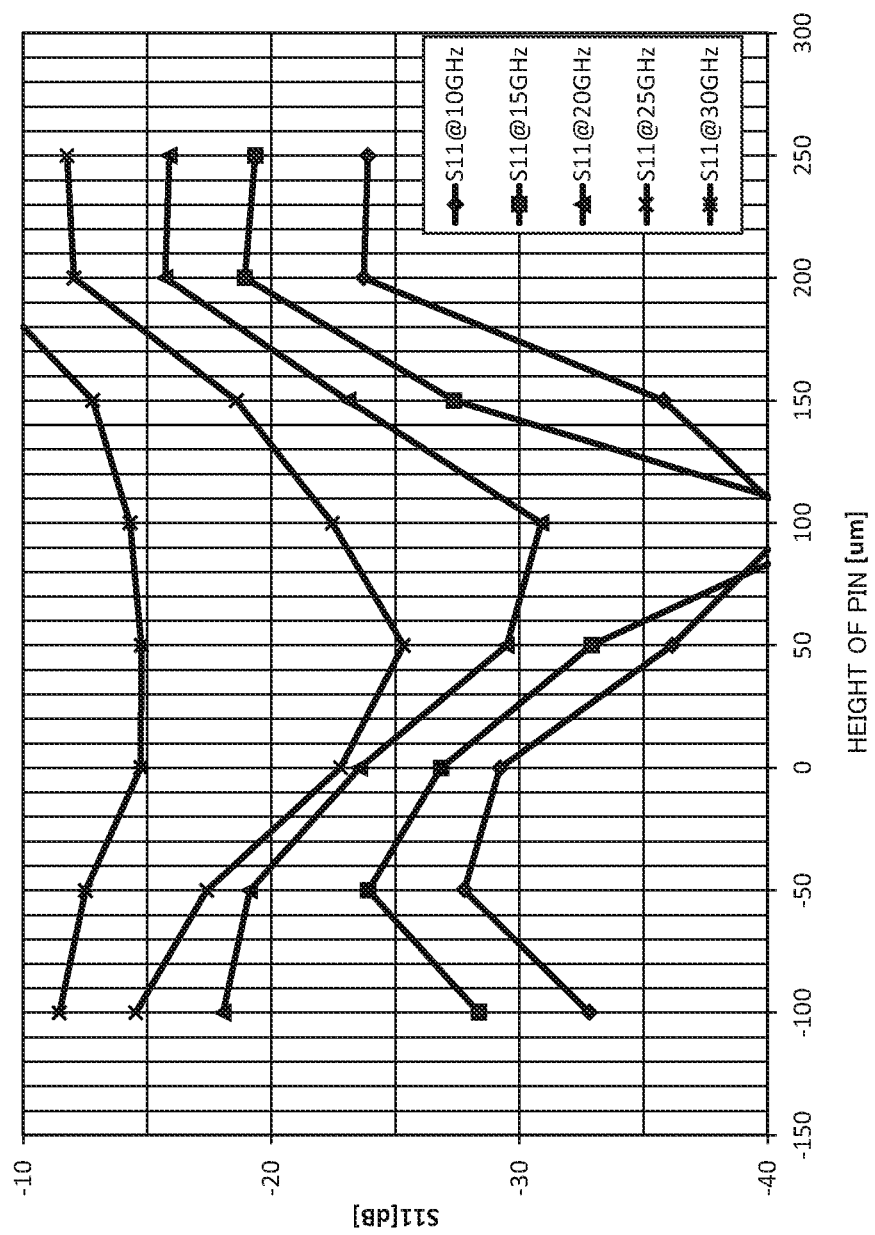
FIG. 7 shows reflection characteristics of the optical subassembly according to the embodiment of the invention.

FIG. 7 shows reflection characteristics of the optical subassembly 101 according to the embodiment. FIG. 7 shows the result of calculating reflection characteristics S11 (dB) to a height h by the high-frequency three-dimensional electromagnetic field simulator HFSS. A plurality of curves in FIG. 7 shows reflection characteristics with a plurality of frequencies. Specifically, the results with frequencies of 10 GHz, 15 GHz, 20 GHz, 25 GHz, and 30 GHz are shown in order from the bottom of the illustration. To transmit a signal of 25 Gbits/s, it is desirable that the reflection characteristics to 25 GHz are restrained to approximately −15 dB or below. As shown in FIGS. 6 and 7, it is desirable that the height h of the end faces of the differential signal terminals 111 is within a range of +180 μm to −100 μm. To maintain a high-quality transmission property, it is more desirable that the reflection characteristics S11 are restrained to −20 dB or below and that the height h is within a range of +120 μm to −30 μm.

In the foregoing calculations, the thickness of the nail head sections 111A is 150 μm. It is more desirable that the height h of the end faces of the differential signal terminals 111 is within a range of 0 μm to +50 μm. In this case, at least a part of the nail head sections 111A is arranged inside the penetration holes in the metal disk 113, and the thickness of the part situated inside the penetration holes in the metal disk 113, of the nail head sections 111A, is 150 µm to 100 µm.

Currently, a majority of the internet and telephone networks is constructed by optical communication networks. Optical modules used as routers/switches, which are optical communication devices, and as interfaces of transmission devices, play the important role of converting electrical signals into optical signals. Generally, an optical module includes an optical subassembly which accommodates an optical semiconductor device, a printed circuit board on which a drive IC or the like for outputting/inputting a modulated electrical signal is mounted, and flexible printed circuits which connect the optical subassembly and the printed circuit board. Recently, not only higher speeds but also lower costs have been increasingly demanded of optical modules. There is a growing demand for a low-cost optical module capable of transmitting and receiving high-speed optical signals of 25 Gbits/s grade. An optical module that meets such demands includes, for example, a TO-CAN package type optical subassembly having a metal stem which is enclosed in a canister-like package and from which a lead terminal protrude to be inserted in a printed circuit board or the like. The invention is optimum for such an optical module. To transmit a modulated electrical signal of 25 Gbits/s grade to an optical semiconductor device, characteristic impedance needs to accurately match the output impedance of a drive IC. The invention can realize such impedance matching.

Figure 8:
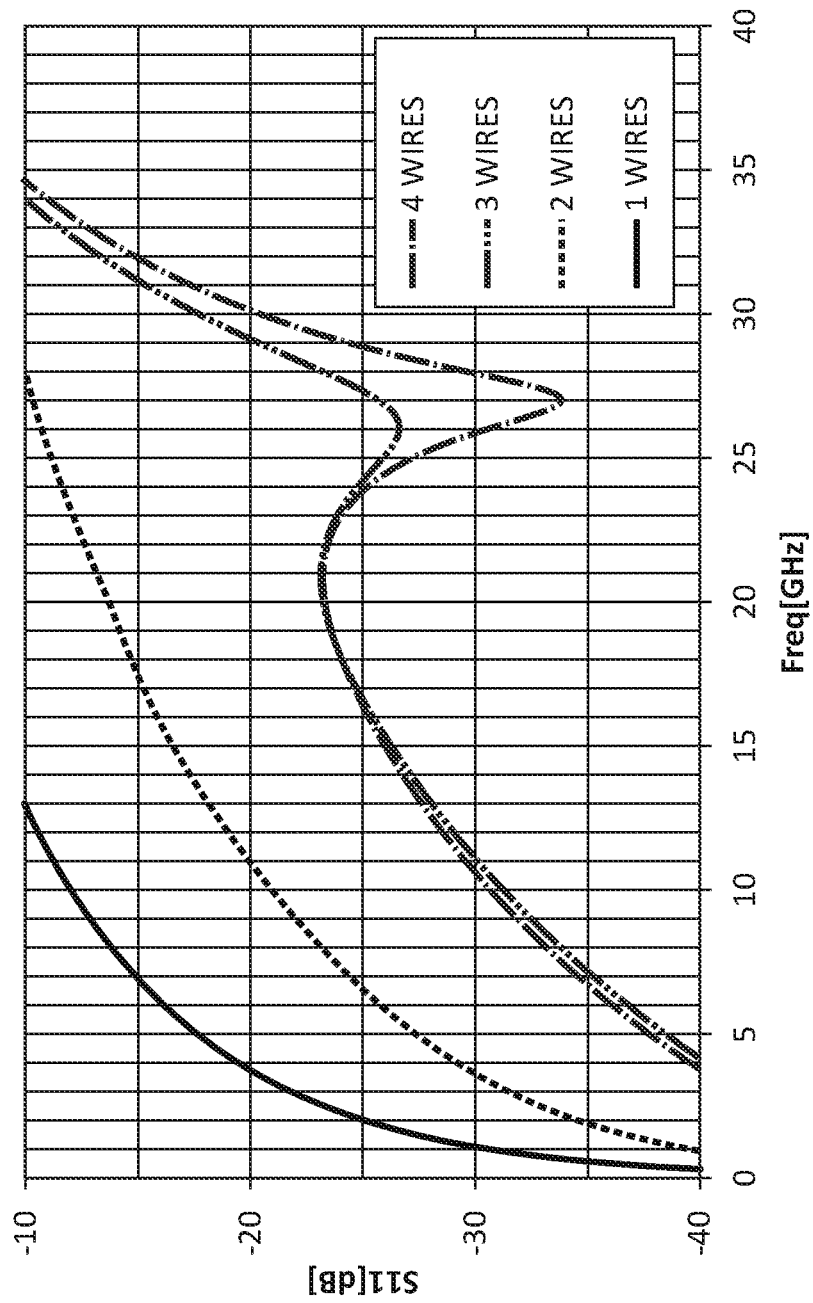
FIG. 8 shows reflection characteristics of the optical subassembly according to the embodiment of the invention.

FIG. 8 shows reflection characteristics of the optical subassembly 101 according to the embodiment. FIG. 6 shows the result of calculating reflection characteristics S11 (dB) to a frequency by the high-frequency three-dimensional electromagnetic field simulator HFSS. A plurality of curves in FIG. 8 shows reflection characteristics with different numbers of bonding wires 118 for wire bonding to one differential signal terminal. Specifically, the results with 1 wire, 2 wires, 3 wires, and 4 wires are shown in order from the top of the illustration. Such calculations uses a condition that the height h of the end faces of the differential signal terminals 111 is adjusted to an optimum position. As illustrated in FIG. 8, if the number of bonding wires 118 is three or more, the reflection characteristics S11 having a target value of −20 dB or below are realized at a frequency of 25 GHz. However, if the number of bonding wires 118 is two or less, required frequency characteristics cannot be maintained. Increasing the number of bonding wires 118 can lead to a reduction in the parasitic inductance of the bonding wires 118.

The embodiment can realize an optical subassembly which can transmits signals up to high frequency domains and which can be manufactured inexpensively, without having a conductor plate in a complex shape or other complex components. Even with a simplified manufacturing process, the potential of assembly failure can be reduced and an optical subassembly in which high-frequency characteristics are not deteriorated can be realized.

It is desirable that the plurality of (in this example, three or more) bonding wires 118 is connected to each wiring pattern 117, spreading further from the site connected to the end face of the differential signal terminal 111. Since the plurality of bonding wires 118 are spaced further apart from each other as it goes away from the end face of the differential signal terminal 111, mutual inductance generated between the plurality of bonding wires 118, particularly, mutual inductance generated between the bonding wires 118 next to each other can be reduced. Therefore, the parasitic inductance of the bonding wires 118 can be reduced and the maximum value of characteristic impedance can be reduced. Since a plurality of (in this example, four) bonding wires 118 spreads and is connected to the wiring pattern 117, the capacitance in the characteristic impedance increases, corresponding to the time when a pulse reaches the connection site with the wiring pattern 117, as illustrated in the change in characteristic impedance with time in FIG. 5.

The pair of wiring patterns 117 are connected respectively to the pair of electrodes of the optical semiconductor device 116, as shown in FIG. 4. Also, it is desirable that each of the pair of wiring patterns 117 spreads and extends from the connection site with the optical semiconductor device 116 to the connection site with the plurality of bonding wires 118, as viewed in a plan view of the top surface of the ceramic substrate 115. That is, it is desirable that the width of each of the pair of wiring patterns at the connection site with the plurality of bonding wires 118 is broader than the width of the wiring pattern at the connection site with the optical semiconductor device 116 (or the width of the wiring pattern between these connection sites). Securing a large area at the connection site with the plurality of bonding wires 118 allows the neighboring bonding wires 118 to be spaced further apart. This can reduce the influence of mutual inductance, increase the capacitance, and compensate for the increase in inductance.

In the embodiment, the flat surfaces of the pair of wiring patterns 117 intersect the end faces on the inner surface side of the pair of differential signal terminal 111 (end faces of the nail head sections 111A). Normally, wire bonding connects planes parallel to each other. However, for the stem 104 according to the embodiment, wire bonding is carried out by the following manufacturing processes. First, a device which holds the stem 104 and has a rotation mechanism is prepared. Second, the stem 104 according to the embodiment is loaded and held on this device. Third, one end of a bonding wire 118 is brazed to one of the pair of differential signal terminals and the pair of wiring patterns 117. Fourth, the device is rotated. Ideally, the device may be rotated by 90 degrees. However, the device may be rotated according to the angle of intersection between the flat surfaces of the pair of wiring patterns 117 and the end faces of the pair of differential signal terminal 111. Fifth, the other end of the bonding wire 118 is brazed to the other of the pair of differential signal terminal and the pair of wiring patterns 117. The third to fifth processes can be carried out multiple times to connect the plurality of bonding wires 118.

The optical subassembly, the optical module, the optical transmission equipment, and the optical transmission system according to an embodiment of the invention have been described. The invention is not limited to the embodiment and various modifications can be made. The invention can be applied broadly. The configuration described in the embodiment can be replaced by a configuration that is substantially the same, a configuration having the same advantageous effects, or a configuration that can achieve the same object. While the metal disk 113 is used in the embodiment, the disk shape is not essential and the disk shape need not be perfect, either. A disk shape that is partly cut out or partly protrudes may be employed. Other shapes such as quadrilateral may be employed as well. The conductor plate is not limited to metal and may also be made up of other good conductors. The optical subassembly 101 according to the embodiment is a TO-CAN package type but may also be a box type. In this case, the wiring board is a field through realized by a dielectric board.

The optical semiconductor device 116 provided in the optical subassembly 101 according to the embodiment is a semiconductor laser device, which is a light emitting device, and the optical subassembly 101 is a TOSA. However, this is not limited. The optical subassembly may be a ROSA (receiver optical subassembly), and the optical semiconductor device provided in the optical subassembly may be a light receiving device such as a photodiode. The optical subassembly may also be a BOSA (bidirectional optical subassembly).

The optical subassembly may further include a Peltier device within the package, depending on the use. In this case, in addition to the Peltier device, the wiring board (thin film board) equipped with the optical semiconductor device is installed on the conductor plate serving as a heat radiation surface. It is desirable that the wiring board installed on the Peltier device is as small as possible in order to restrain power consumption at the time of adjusting temperature. It is also desirable that the number of bonding wires is reduced in order to prevent inflow of heat to the wiring board on which the optical semiconductor device is installed. The invention can also be applied to this case.

The optical subassembly further including the Peltier device may have two boards (here, referred to as second wiring board and relay board) instead of the single wiring board. On the relay board, the plurality of bonding wires and the pair of lead terminals are connected together. The optical semiconductor device is installed on the second wiring board. The pair of wiring patterns arranged respectively on the second wiring board and the relay board are electrically connected to each other. Such a configuration eliminates the need to reduce the number of bonding wires in view of power consumption and thus optimizes the invention.

The bonding wires 118 according to the embodiment may be known wires. However, it is desirable that the plurality of bonding wires 118 are ribbon wires, provided that a tool for connection can be prepared. Using ribbon wires eliminates the need for a plurality of rounds of wire connection and also enables the parasitic inductance of the wires to be restrained. However, the end parts of the pair of lead terminals (nail head sections 111A of the pair of differential signal terminal 111) have large inductance that is not negligible, in order to transmit a modulated electrical signal of 25 Gbits/s grade. Therefore, when ribbon wires are used, it should be noted that the ribbon wires should be designed to achieve desired characteristic impedance, using a configuration to compensate for the parasitic inductance of the ribbon wires.

In the embodiment, the pair of differential signal terminal 111 are used. However, this is not limited. Other lead terminals may be used. For example, two signal terminals, each for single-end transmission, may be employed. Also, while the stem 104 according to the embodiment has two penetration holes with a pair of lead terminals arranged therein, this is not limited. Another signal terminal or the like may be provided additionally. Moreover, while one ground terminal is brazed to the metal disk 113 of the stem 104, this is not limited. Another ground terminal may be provided additionally.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical subassembly comprising:
   a conductor plate having a pair of penetration holes, both penetrating the conductor plate from an outer surface to an inner surface;
   a pair of lead terminals fixed in the two respective penetration holes by a dielectric and passing through the pair of penetration holes from the outer surface to the inner surface;
   a wiring board with a pair of wiring patterns arranged on a surface thereof;
   a plurality of bonding wires electrically connecting the pair of lead terminals and the pair of wiring patterns; and
   a pedestal section arranged protruding from the inner surface of the conductor plate,
   wherein a cross section of the pair of lead terminals at an end part on an inner surface side is larger than a cross section at an end part on an outer surface side,
   wherein end faces on the inner surface side of the pair of lead terminals are situated within a range of +180 μm to −100 μm from the inner surface of the conductor plate in a direction perpendicular to the inner surface,
   wherein the wiring board is arranged on a top surface of the pedestal section,
   wherein the plurality of bonding wires directly connect the end faces on the inner surface side of the pair of lead terminals and the pair of wiring patterns, and
   wherein a plane defined by flat surfaces of the pair of wiring patterns on the wiring board intersects a plane defined by the end faces on the inner surface side of the pair of lead terminals.

2. The optical subassembly according to claim 1, wherein three or more of the bonding wires connect one of the pair of lead terminals and one of the pair of wiring patterns.

3. The optical subassembly according to claim 2, wherein the three or more bonding wires spread from a site connected to the end face on the inner surface side of the one of the pair of lead terminals and are connected to the one of the pair of wiring patterns.

4. The optical subassembly according to claim 1, wherein the plurality of bonding wires connecting one of the pair of lead terminals and one of the pair of wiring patterns are ribbon wires.

5. The optical subassembly according to claim 1, further comprising:
   an optical semiconductor device arranged on the wiring board,
   wherein the pair of wiring patterns connects to each of a pair of electrodes of the optical semiconductor device and each spreads and extends from a connection site with the optical semiconductor device to a connection site with the plurality of bonding wires, as viewed in a plan view.

6. The optical subassembly according to claim 1, wherein the wiring board is configured of a relay board to which the plurality of bonding wires are connected and a second wiring board electrically connected to the relay board.

7. The optical subassembly according to claim 6, further comprising:
   an optical semiconductor device arranged on the second wiring board.

8. An optical module comprising the optical subassembly according to claim 1.

9. An optical transmission equipment equipped with the optical module according to claim 8.

* * * * *